United States Patent [19]

Sauer

[11] Patent Number: 5,600,283

[45] Date of Patent: Feb. 4, 1997

[54] DC ISOLATED DIFFERENTIAL OSCILLATOR HAVING FLOATING CAPACITOR

[75] Inventor: Don R. Sauer, San Jose, Calif.

[73] Assignee: National Semiconductor Corporation, Santa Clara, Calif.

[21] Appl. No.: 527,400

[22] Filed: Sep. 13, 1995

[51] Int. Cl.⁶ .......................... H03K 3/0231; H03F 3/45
[52] U.S. Cl. .......................... 331/111; 330/252; 331/143
[58] Field of Search .................................. 331/111, 143; 330/252, 259, 260

[56] References Cited

U.S. PATENT DOCUMENTS

| | | | |
|---|---|---|---|
| 4,362,999 | 12/1982 | Sauer | 329/103 |
| 4,494,088 | 1/1985 | Goutowski et al. | 331/111 |
| 4,871,985 | 10/1989 | Sempel | 331/111 |

*Primary Examiner*—Siegfried H. Grimm
*Attorney, Agent, or Firm*—Skjerven, Morrill, MacPherson, Franklin & Friel; Paul J. Winters; William J. Paradice

[57] ABSTRACT

An oscillator includes a small on-chip floating capacitor having equal parasitic leakages on each of its two plates. The oscillator is fully differential and, being responsive only to differential signals, ignores common mode parasitic leakages of the capacitor. This feature allows for a minimizing of the size of the capacitor as well as enabling the oscillator to operate on purely DC currents which, in turn, allows the output state of the oscillator to toggle without creating current spikes on the supplies. By eliminating these spikes, the oscillator does not suffer from substrate crosstalk problems and thus may be used in mixed signal applications without perturbing the operation of sensitive analog circuitry.

13 Claims, 4 Drawing Sheets

DC ISOLATED DIFFERENTIAL OSCILLATOR HAVING FLOATING CAPACITOR

CROSS REFERENCE TO RELATED APPLICATION

This application is related to commonly owned U.S. Patent Application entitled "FLOATING CAPACITOR DIFFERENTIAL INTEGRATOR" filed on Sep. 13, 1995, Ser. No. 08/527,401 and attorney docket number NS-2867 US.

BACKGROUND

1. Field of the Invention

The present invention relates to digital oscillators having a constant DC supply current.

2. Description of Related Art

FIG. 1 shows a conventional oscillator 10 including a differential op amp 11 connected to +5 and −5 volt supplies and having an output terminal $V_{out}$. A positive feedback loop consisting of equal value resistors 12 and 13 is coupled between the non-inverting and output terminals of op amp 11, and a negative feedback loop consisting of resistor 14 and capacitor 15 is coupled between the inverting and output terminals of op amp 11.

When power is initially provided to oscillator 10, output $V_{out}$ will be at either the +5 or −5 volt rail. For the discussion that follows, we will assume that $V_{out}$ is initially at the +5 volt rail. A toggle voltage of approximately 2.5 volts will appear at the non-inverting terminal of op amp 11 via positive feedback resistors 12 and 13. Current flowing through resistor 14 will charge capacitor 15 towards the toggle voltage of 2.5 volts. As the inverting terminal of op amp 11 reaches 2.5 volts, $V_{out}$ will swing low to −5 volts.

Once $V_{out}$ toggles low to −5 volts, resistors 12 and 13 will pull the non-inverting terminal of op amp 11 down to approximately −2.5 volts. Capacitor 15 will then discharge and gradually pull the inverting terminal of op amp 10 to −2.5 volts. Just as the inverting terminal voltage reaches that of the non-inverting terminal, i.e., −2.5 volts, op amp 11 toggles $V_{out}$ high to 5 volts. In this manner, $V_{out}$ oscillates between 5 and −5 volts, where the oscillation frequency depends upon the RC time constant of the negative feedback loop.

Oscillator 10 has associated therewith several disadvantages. First, oscillator 10 draws an undesirably large amount of supply current from the 5 and −5 volt supplies, thereby resulting in an undesirable amount of power dissipation. Second, capacitor 15 is typically on the order of a few micro-Farads and, being too large to form as an on-chip component, must be formed as a discrete element. Such discrete capacitors are not only expensive but also result in a wasting of a large amount of board area.

Further, oscillator 10 is problematic for some mixed signal applications in which digital and analog components are formed on a common substrate. As the oscillating frequency increases, the slew rate of $V_{out}$ causes undesirable current spikes on the +5 and −5 volts supplies. These current spikes, commonly known as switching transients, may be coupled from oscillator 10 to the sensitive analog circuitry (not shown) via the common substrate. This digital to analog crosstalk phenomenon may perturb the operation of the sensitive analog circuitry. It would thus be desirable to reduce the effects of such digitally-generated switching transients upon the operation of the analog components.

SUMMARY

An oscillator is disclosed which overcomes problems in the art described above. In accordance with the present invention, an oscillator includes a small on-chip floating capacitor having equal parasitic leakages on each of its two plates. The oscillator is fully differential and, being responsive only to differential signals, ignores common mode parasitic leakages of the capacitor. This feature allows for a minimizing of the size of the capacitor as well as enabling the oscillator to operate on purely DC currents which, in turn, allows the output state of the oscillator to toggle without creating current spikes on the supplies. By eliminating these spikes, the oscillator does not suffer from substrate crosstalk problems and thus may be used in mixed signal applications without perturbing the operation of sensitive analog circuitry.

DETAILED DESCRIPTION

Figure 2:
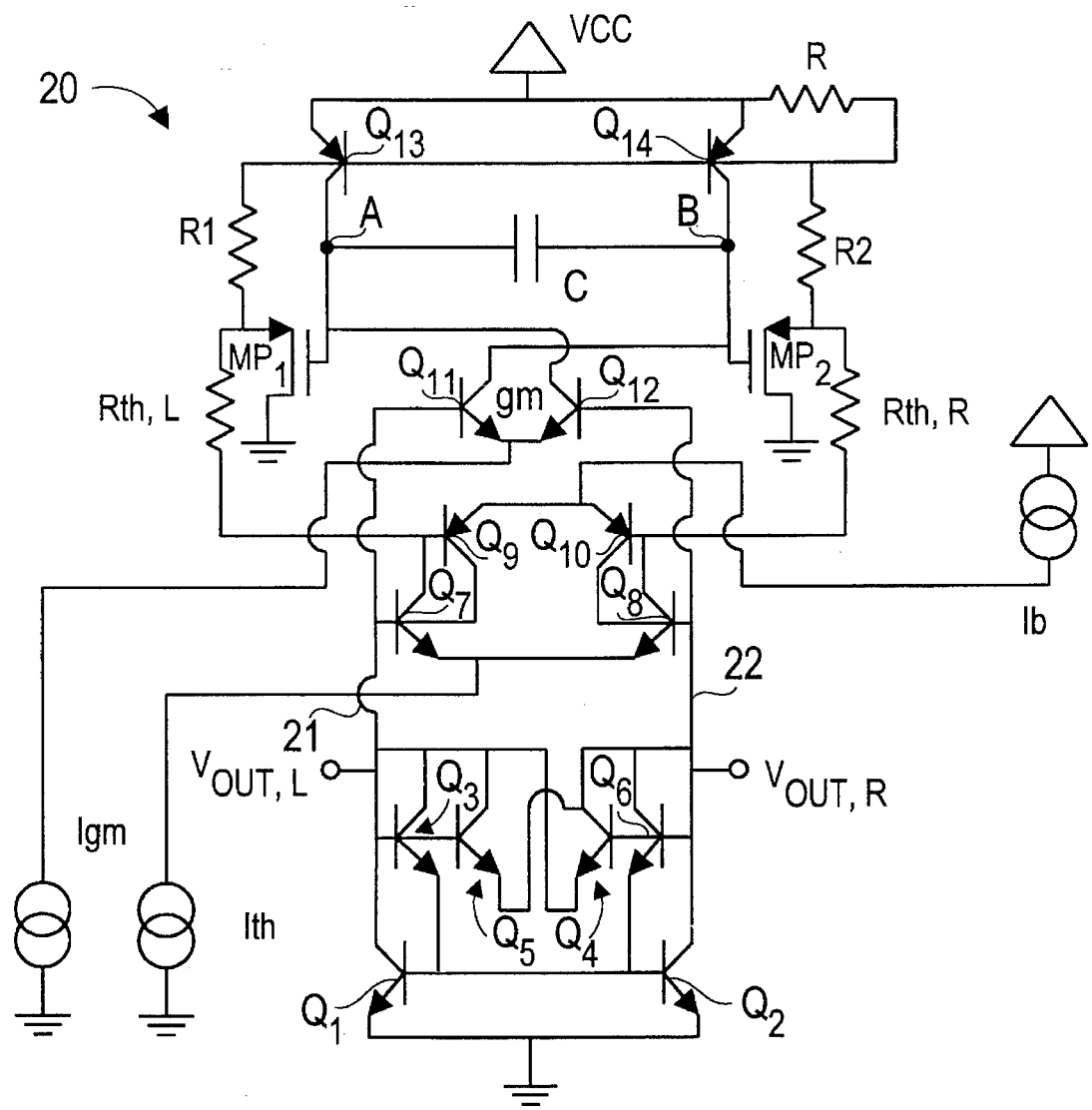
FIG. 2 is an oscillator in accordance with the present invention.

The preferred embodiment will be described below with reference to FIGS. 2–4. FIG. 2 shows an oscillator 20 in accordance with the present invention. NPN transistors Q1–Q6 form a gain stage which is connected between right and left output terminals, $V_{out,r}$ and $V_{out,l}$, respectively, of oscillator 20. NPN transistors Q7 and Q8, together with resistors $R_{th,1}$ and $R_{th,r}$, provide a differential positive feedback. PNP transistors Q9 and Q10 form a differential comparator, while capacitor C and a $g_m$ stage formed by NPN transistors Q11 and Q12 provide a differential negative feedback. The $g_m$ stage is driven by current source $I_{gm}$ which, in turn, determines the slew rate of capacitor C. Current source $I_{th}$ and resistors $R_{th,r}$ and $R_{th,l}$ determine the toggle voltage of capacitor C, while resistors $R_1$ and $R_2$ determine the common mode, or average, voltage of capacitor C. Current source $I_b$ biases transistors Q9 and Q10. PNP transistors Q13 and Q14, along with biasing resistor R, form two equal current sources to provide current to both nodes of capacitor C. Oscillator 20 provides a differential output voltage at output terminals $V_{out,r}$ and $V_{out,l}$.

Oscillator 20 is a fully differential circuit and, as such, ignores common mode voltages and currents. Upon initial powering of oscillator 20, the voltage across capacitor C will be approximately zero and output terminals $V_{out,r}$ and $V_{out,l}$ will toggle to one of two possible states. In the discussion of oscillator 20 which follows, it is presumed that $V_{out,r}$ is high and $V_{out,l}$ is low.

The higher voltage at $V_{out,r}$ causes transistor Q8 to steer the current Ith almost entirely through $R_{th,r}$ thereby creating a voltage drop across $R_{th,r}$ of approximately $I_{th}$ times $R_{th,r}$ and a voltage drop across $R_{th,l}$ of approximately zero. The current steering action of transistor Q8 also results in the base of transistor Q10 being pulled lower than the base of transistor Q9. Transistor Q10 thus steers more of current $I_b$ through line 22 than is steered through line 21 via transistor Q9, thereby sustaining the present output state.

The higher voltage at $V_{out,r}$ also causes transistor Q12 to turn on harder than transistor Q11. Noting that the collector currents of transistors Q13 and Q14 must equal one another, transistor Q12 will thus sink a portion of the collector current of transistor 14 through capacitor C, thereby gradually charging capacitor C. As a result, node B will gradually rise and node A will gradually fall. Note, however, that the common mode voltage of capacitor C remains constant, that is, each incremental increase in voltage at node B is balanced by an equal incremental decrease in voltage at node A.

The source voltage of PMOS transistor MP1 follows its gate voltage. Thus, as node A falls, the source of transistor MP1 falls which, in turn, causes the base of transistor Q9 to fall. In a similar manner, a rising node B causes the base of transistor Q10 to rise. Resistors $R_1$ and $R_2$ are of equal resistances such that the base voltages of transistors Q13 and Q14 will remain constant. Note that the base voltages of transistors Q13 and Q14 change only in response to a change in the average voltage of nodes A and B.

Capacitor C will continue charging until the bases of transistors Q9 and Q10 are approximately equal, i.e., until there is no longer a voltage differential across the comparator. The now equal currents flowing in lines 21 and 22 result in equal voltages across transistors Q7 and Qs. The previous voltage drops $R_{th,r}$ times $I_{th}$ across $R_{th,r}$ and the previous zero drop across $R_{th,l}$ will cause a sudden jump in the base voltage of transistor Q10 and a corresponding fall in the base voltage of transistor Q9, respectively. In response, the comparator steers nearly all of the current $I_b$ through line 21 via transistor Q9 which, as will be explained below, causes the output state to toggle, where $V_{out,l}$ is forced high and $V_{out,r}$ is forced low.

This new state of output terminals $V_{out,r}$ and $V_{out,l}$ causes the $g_m$ stage to steer current through capacitor C from node A to node B, thereby discharging capacitor C. Node A will gradually rise and node B will gradually fall in equal voltage increments. Capacitor C will continue discharging, and nodes A and B will toggle in a manner opposite that described above, until the comparator is again triggered, i.e., until the bases of transistors Q9 and Q10 are equal, at which time the output state will toggle to its initial state, e.g., $V_{out,r}$ high and $V_{out,l}$ low.

The oscillation frequency of oscillator 20 is determined by the slew rate of capacitor C and by the voltage swing of capacitor C. As mentioned above, current source $I_{gm}$ sets the slew rate of capacitor C while current source $I_{th}$ and resistors $R_{th,r}$ and $R_{th,l}$ sets the voltage swing of capacitor C.

In the preferred embodiment, capacitor C is a 10 pico-Farad on-chip floating capacitor exhibiting equal parasitic leakages on each of its plates. Such a capacitor is preferably formed by parallel connecting a pair of conventional 5 pico-Farad CMOS or BiCMOS capacitors, as illustrated in FIG. 3, which shows a portion 20a of oscillator 20. Diodes $D_1$ and $D_2$ model the parasitic leakages of capacitors $C_1$ and $C_2$, respectively. Thus, in the discussion that follows, references to capacitor C are equally applicable to the modelled structure of capacitors $C_1$ and $C_2$ and diodes $D_1$ and $D_2$, and vice versa.

The operation of oscillator 20, as described above, is fully differential. Capacitor C floats at a constant common mode voltage and, thus, the voltage across capacitor C is purely differential. Since each side of the capacitor, i.e., nodes A and B, may rise higher and fall below the common mode voltage, oscillator 20 is able to achieve a signal to noise ratio double those oscillators which employ a fixed capacitor, e.g., a capacitor in which one plate is tied to a constant voltage such as ground. The common mode voltage of capacitor C, which is determined by resistors R, $R_1$ and $R_2$, should be set equal to approximately one half of the voltage of the supply voltage (not shown).

Figure 2A:
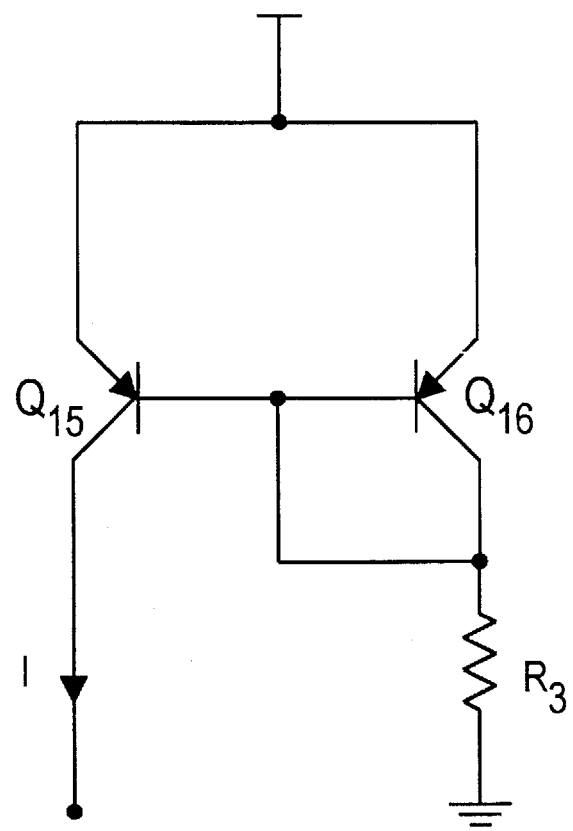
FIG. 2a is a current source which may be used in conjunction with the oscillator of FIG. 2.

In other embodiments of the present invention, resistor R may be replaced with a current source referenced from the supply voltage $V_{cc}$, as shown in FIG. 2a, where transistors Q15 and Q16 are PNP transistors and resistor $R_3$ is of a resistance equal to that of resistors $R_1$ and $R_2$. Such a current source will enable nodes A and B to remain at one-half the supply voltage even during supply voltage fluctuations, thereby optimizing the dynamic voltage range of capacitor C.

Figure 3:
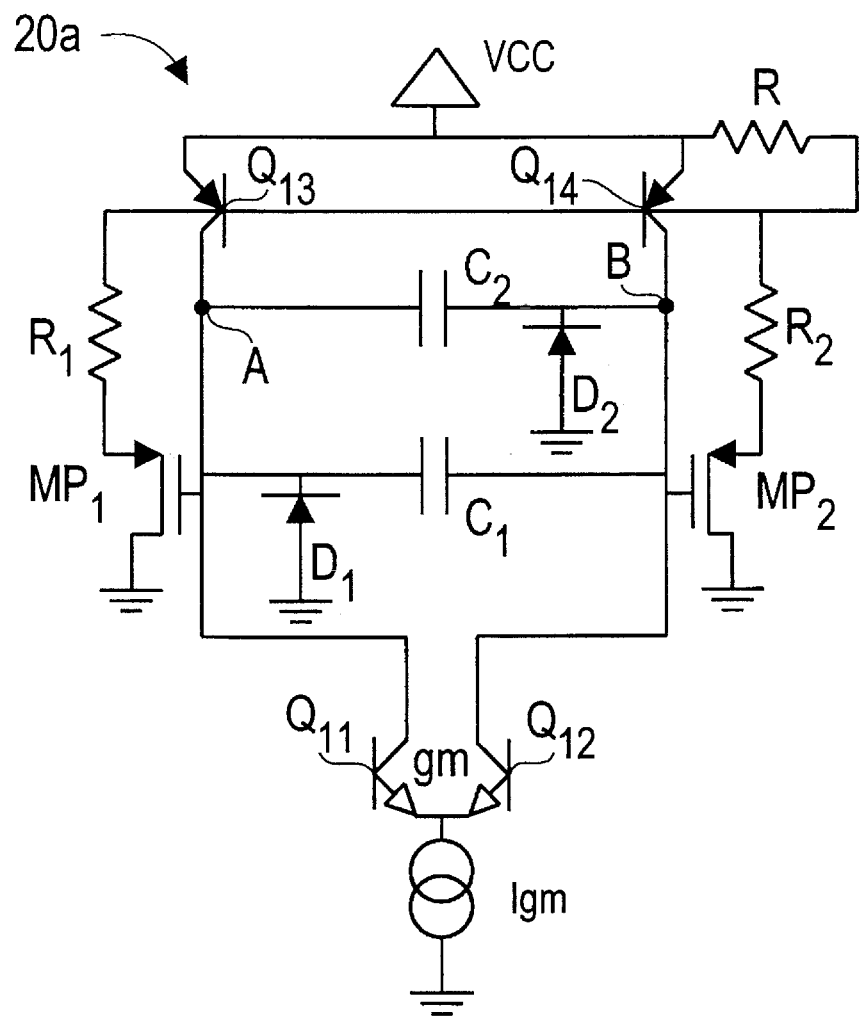

Referring also to FIG. 3, the $g_m$ stage formed by transistors Q11 and Q12 is fully differential and, steering a constant DC current $I_{gm}$ through portion 20a of oscillator 20, ignores all common mode voltages and currents.

Figure 1:
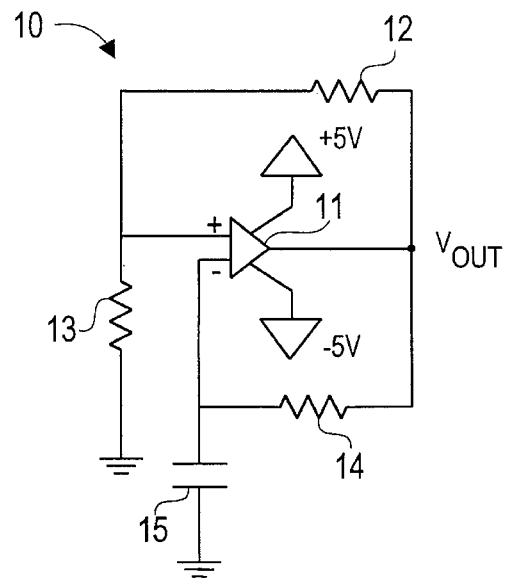
FIG. 1 is a conventional RC oscillator circuit.
Figure 4:
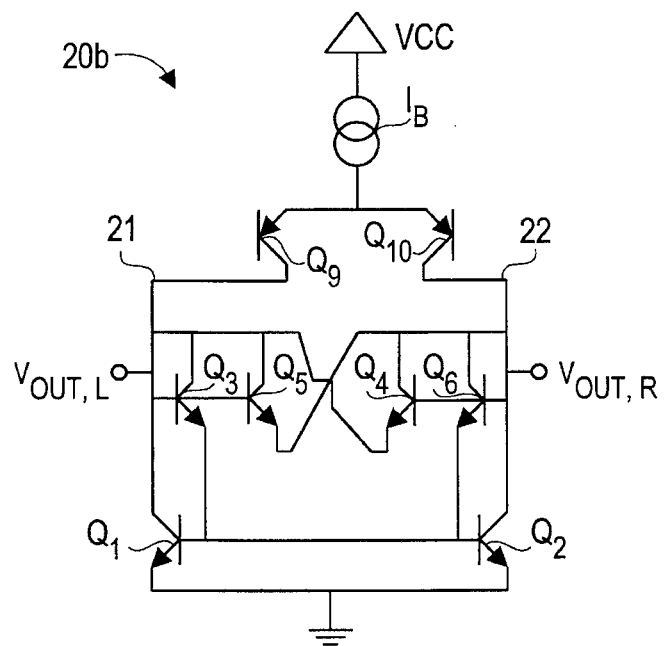
FIGS. 3 and 4 are first and second portions, respectively, of the oscillator of FIG. 2.

Referring also to FIG. 4, which shows a portion 20b of oscillator 20, the comparator formed by transistors Q9 and Q10 is fully differential. The gain stage, formed by transistors Q1–Q6, provides a differential voltage across output terminals $V_{out,r}$ and $V_{out,1}$ in response to a much smaller voltage differential across capacitor C as follows. Assuming oscillator 20 to be in its initial state, where $V_{out,r}$ is high and $V_{out,1}$ is low, the comparator will, as described above, steer the current $I_b$ through transistor Q10. A greater current flows through line 22 than does through line 21, thereby giving rise to a differential current. Since the collector currents of transistors Q1 and Q2 must be equal, a portion of the current $I_b$ flowing in line 22 flows through the base-emitter junction of transistor Q4 and into the collector of transistor Q1. As a result, $V_{out,r}$ will be approximately two diode drops above ground ($V_{be}$ of Q2+$V_{be}$ of Q6), and $V_{out,l}$ will be only one diode drop above ground (i.e., $V_{out,r}$–$V_{be}$ of Q4).

As capacitor C charges and creates a voltage differential between nodes A and B, the differential voltage across the comparator will, as discussed above, approach zero. With the base voltages of transistors Q9 and Q10 equal, the current $I_b$ will be equally divided between transistors Q9 and Q10, thereby resulting in equal currents flowing in lines 21 and 22. Since the gain stage is fully differential, and thus symmetrical, the currents and voltages associated with each of transistors Q1, Q3, and Q5 will equal those of respective corresponding transistors Q2, Q4, and Q6. Accordingly, the output terminals $V_{out,r}$ and $V_{out,l}$ will be at equal voltages. The gain stage formed by transistors Q1–Q6 consumes minimal current and, therefore, results in a reduction in power consumption.

The sudden jump in the base voltage of transistor Q10 and the corresponding sudden fall in the base voltage of transistor Q9 will, as described earlier, cause a greater portion of the current $I_b$ to flow in line 21 than in line 22. This differential current will, in a manner similar to that described above, force $V_{out,l}$ high to approximately two diodes drops above ground while simultaneously forcing $V_{out,r}$ to approximately one diode drop above ground.

Applicant has found that the output terminals $V_{out,r}$ and $V_{out,l}$ may be toggled between one and two $V_{be}$'s as described above in response to nodes A and B toggling only a few millivolts. In such a manner, the gain stage formed by transistors Q1–Q6 exhibits a gain factor in excess of 100 without requiring any resistors, thereby saving valuable die area as well as reducing power dissipation. Further, the elimination of gain resistors further advantageously allows oscillator 20 to draw a supply current on the order of only pico-Amps.

The fully balanced and differential nature of oscillator 20 results in other advantages over conventional oscillators. Being responsive to only differential currents and voltages, oscillator 20 ignores any common mode parasitic leakage currents of capacitor C (as modelled by diodes $D_1$ and $D_2$ in FIG. 3) which, in turn, allows the current $I_{gm}$ to be made small such that the frequency response of the negative feedback network can be made low while using a reasonably sized capacitor C. This differential feature also allows oscillator 20 to operate using purely DC currents, thereby allowing output terminals $V_{out,r}$ and $V_{out,l}$ to toggle without creating current spikes on the supplies. Thus, by eliminating AC switching transients, and the substrate crosstalk associated therewith, oscillator 20 may be used in mixed signal applications without perturbing the operation of sensitive analog components formed on a common substrate. That is, any such analog circuitry sees oscillator 20 as a current source, i.e., a resistor hanging from a voltage supply. In effectively isolating the operation of oscillator 20 from surrounding circuitry, the differential nature of oscillator 20 allows, in the IC world, for the elimination of two pins (e.g., digital ground and analog ground) as well as two coupling capacitors previously required to minimize digital-to-analog crosstalk. This savings in pins and capacitors results in not only a more convenient circuit layout but also results in a savings in silicon real estate.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. In particular, the polarities of the bipolar and MOS transistors may reversed while still realizing the benefits of the above described invention.

What is claimed is:

1. An oscillator circuit comprising:

first and second output terminals for providing a differential output signal;

a differential transconductance stage having first and second inputs connected to said first and second output terminals, respectively, and having first and second outputs;

a capacitive element coupled between said first and second outputs of said transconductance stage, said transconductance stage charging said capacitive element in response to said differential output signal;

a differential positive feedback circuit having first and second inputs coupled to said first and second output terminals, respectively, and having first and second outputs coupled across said capacitive element, said positive feedback circuit providing a toggle voltage; and a comparator having first and second inputs coupled across said capacitive element and having first and second outputs coupled to said first and second output terminals, respectively, said comparator comparing the voltage across said capacitive element to said differential output signal and toggling said output differential signal in response thereto.

2. The circuit of claim 1 further comprising a gain stage coupled between said first and second output terminals.

3. The circuit of claim 2 wherein said transconductance stage further comprises:

first transistor having a base coupled to said first output terminal, a collector coupled to a first terminal of said capacitive element, and an emitter; and a second transistor having a base coupled to said second output terminal, a collector coupled to a second terminal of said capacitive element, and an emitter coupled to said emitter of said first transistor.

4. The circuit of claim 2 wherein said gain stage comprises:

a first transistor having an emitter coupled to ground, a collector coupled to said first output terminal, and a base coupled to a node;

a second transistor having an emitter coupled to ground, a collector coupled to said second output terminal, and a base coupled to said node;

a third transistor having an emitter coupled to said node and having a collector and a base coupled to said first output terminal;

a fourth transistor having a collector and a base coupled to said first output terminal and having an emitter coupled to said second output terminal;

a fifth transistor having a collector and a base coupled to said second output terminal and having an emitter coupled to said first output terminal; and a sixth transistor having an emitter coupled to said node and having a collector and a base coupled to said second output terminal.

5. The circuit of claim 1 wherein said capacitive element further comprises first and second MOS capacitors connected in parallel.

6. The circuit of claim 1 wherein said positive feedback circuit further comprises:

a first transistor having a base coupled to said first output terminal, a collector coupled to said first input of said comparator, and an emitter; and a second transistor having a base coupled to said second output terminal, a collector coupled to said second input of said comparator, and an emitter coupled to said emitter of said first transistor.

7. The circuit of claim 6 wherein said positive feedback circuit further comprises:

a third transistor having a gate coupled to a first node of said capacitive element and having a source and a drain;

a first resistor having a first end coupled to said source of said third transistor and a second end coupled to said collector of said first transistor;

a fourth transistor having a gate coupled to a second node of said capacitive element and having a source and a drain; and a second resistor having a first end coupled to said source of said fourth transistor and a second end coupled to said collector of said second transistor.

8. The circuit of claim 7 further comprising a current source having first and second outputs coupled to said first arid second nodes of said capacitive element, respectively.

9. The circuit of claim 8 wherein said current source further comprises:

a fifth transistor having an emitter coupled to a voltage supply, a collector coupled to said first node of said capacitive element, and a base coupled to a node; and a sixth transistor having an emitter coupled to said voltage supply, a collector coupled to said second node of said capacitive element, and a base coupled to said node.

10. The circuit of claim 9 further comprising a third resistor coupled between said voltage supply and said node.

11. The circuit of claim 10 further comprising:

a fourth resistor coupled between said node and said source of said third transistor; and a fifth resistor coupled between said node and said source of said fourth transistor.

12. A gain stage comprising:

a first transistor having an emitter coupled to ground, a collector coupled to a first output terminal, and a base coupled to a node;

a second transistor having an emitter coupled to ground, a collector coupled to a second output terminal, and a base coupled to said node;

a third transistor having an emitter coupled to said node and having a collector and a base coupled to said first output terminal;

a fourth transistor having a collector and a base coupled to said first output terminal and having an emitter coupled to said second output terminal;

a fifth transistor having a collector and a base coupled to said second output terminal and having an emitter coupled to said first output terminal; and a sixth transistor having an emitter coupled to said node and having a collector and a base coupled to said second output terminal.

13. A method for oscillating an output signal at a predetermined frequency, said method comprising the steps of:

generating said output signal;

providing a differential negative feedback for creating a differential voltage across a capacitive element in response to said output signal;

providing a differential positive feedback for creating a toggle voltage;

comparing said differential voltage to said toggle voltage; and inverting said output signal in response to said step of comparing.

* * * * *

UNITED STATES PATENT AND TRADEMARK OFFICE
CERTIFICATE OF CORRECTION

PATENT NO.    :   5,600,283
DATED         :   Feb. 4, 1997
INVENTOR(S)   :   Sauer, Don Roy It is certified that error appears in the above-identified patent and that said Letters Patent is hereby corrected as shown below:

Col. 6, line 53, delete "arid" and insert --and--.

Signed and Sealed this

Nineteenth Day of August, 1997

*Attest:*

BRUCE LEHMAN

*Attesting Officer*              *Commissioner of Patents and Trademarks*